US007642781B2

(12) United States Patent
Ballon et al.

(10) Patent No.: US 7,642,781 B2
(45) Date of Patent: Jan. 5, 2010

(54) HIGH-PASS TWO-DIMENSIONAL LADDER NETWORK RESONATOR

(75) Inventors: Douglas J. Ballon, Gillette, NJ (US); Henning U. Voss, New York, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 64 days.

(21) Appl. No.: 11/403,355

(22) Filed: Apr. 13, 2006

(65) Prior Publication Data
US 2006/0244448 A1    Nov. 2, 2006

Related U.S. Application Data

(60) Provisional application No. 60/671,597, filed on Apr. 15, 2005.

(51) Int. Cl.
*G01V 3/00* (2006.01)
(52) U.S. Cl. ...................... 324/322; 324/318
(58) Field of Classification Search ......... 324/300–322; 600/407–422; 335/185; 333/185, 204, 175
See application file for complete search history.

(56) References Cited

U.S. PATENT DOCUMENTS

| 3,938,091 | A | * | 2/1976 | Atalla et al. ............... 340/5.54 |
| 5,153,517 | A | * | 10/1992 | Oppelt et al. ............... 324/322 |
| 5,191,315 | A | | 3/1993 | Cordery et al. |
| 5,194,811 | A | * | 3/1993 | Murphy-Boesch et al. .. 324/322 |
| 5,212,450 | A | | 5/1993 | Murphy-Boesch et al. |
| 5,515,855 | A | | 5/1996 | Meyer et al. |
| 5,682,893 | A | | 11/1997 | Meyer et al. |
| 5,729,201 | A | | 3/1998 | Jahnes et al. |

(Continued)

FOREIGN PATENT DOCUMENTS

JP    64001309    *    5/1989    ................. 333/219

OTHER PUBLICATIONS

Mario Gentili, "Italian Electronic Identity Card—principle and architecture -"; Proceedings of the 27th VLDB Conference, Apr. 27, 2001; 4 pgs.; Rome, Italy.

(Continued)

*Primary Examiner*—Brij B Shrivastav
(74) *Attorney, Agent, or Firm*—Leydig, Voit & Mayer, Ltd.

(57) ABSTRACT

A high-pass two-dimensional ladder network has been described for high-field MRI and credential applications. The next-to-highest eigenvalue of the network corresponds to a normal mode giving rise to $B_1$ fields with good spatial homogeneity above the resonator plane. Other eigenvalues may also be used for specific imaging applications. In its most basic form, the ladder network is a collection of inductively coupled resonators where each element of the array is represented by at least one conducting strip having a self-inductance L, joined by a capacitor C at one or more points along each resonator. In the strong coupling limit of the inductively coupled high-pass two-dimensional ladder network resonator array, the array produces a high-frequency resonant mode that can be used to generate the traditional quadrature $B_1$ field used in magnetic resonance imaging, and in the limit of weak or zero coupling reduces to a phased array suitable for parallel imaging applications.

29 Claims, 17 Drawing Sheets

U.S. PATENT DOCUMENTS

| | | | |
|---|---|---|---|
| 5,831,532 | A | 11/1998 | Gambino et al. |
| 5,998,999 | A | 12/1999 | Richard et al. |
| 6,008,649 | A * | 12/1999 | Boskamp et al. ............ 324/318 |
| 6,045,043 | A | 4/2000 | Bashan et al. |
| 6,222,427 | B1 * | 4/2001 | Kato et al. ................. 333/185 |
| 6,344,745 | B1 | 2/2002 | Reisker et al. |
| 6,448,873 | B1 * | 9/2002 | Mostov ...................... 333/185 |
| 6,633,209 | B2 * | 10/2003 | Kushitani et al. ........... 333/175 |
| 6,710,598 | B2 | 3/2004 | Leussler et al. |
| 6,776,332 | B2 * | 8/2004 | Allen et al. ................. 235/380 |
| 6,831,460 | B2 | 12/2004 | Reisker et al. |
| 7,081,819 | B2 | 7/2006 | Martinez de Velasco Cortina et al. |
| 7,102,469 | B2 * | 9/2006 | Kim et al. ................... 333/204 |
| 7,180,291 | B2 | 2/2007 | Chmielewski et al. |
| 7,292,038 | B2 * | 11/2007 | Doty .......................... 324/318 |
| 2005/0067497 | A1 | 3/2005 | Jones et al. |
| 2005/0156318 | A1 | 7/2005 | Douglas |
| 2009/0002093 | A1 * | 1/2009 | Itoh et al. ................... 333/120 |

OTHER PUBLICATIONS

Inside Contactless; "Securing ID Documents: Why are governments choosing Contactless IC chips technology?"; pp. 1-27 (27 pgs.); France; website—www.insidecontactless.com; date last visited unknown.

Kristen L. Meyer and Douglas Ballon; "A 3×3 Mesh Two-Dimensional Ladder Network Resonator for MRI of the Human Head"; Journal—Journal of Magnetic Resonance, Series B 107, (1995); pp. 19-24 (6 pgs.); Philadelphia, Pennsylvania.

Kristen L. Meyer, Karl Kim, Tao Li, Paola K. Robert Delapaz, Joy Hirsch, Douglas Ballon; "Sensitivity-Enhanced Echo-Planar MRI at 1.5T Using a 5×5 Mesh Dome Resonator"; Journal—Magnetic Resonance In Medicine, An Official Journal of the International Society for Magnetic Resonance In Medicine; Oct. 1996; 9 pgs.; vol. 36, No. 4; Baltimore, MD.

Jovan Jevtic; "Ladder Networks for Capacitive Decoupling Phased-Array Coils"; Proc. Intl. Soc. Mag. Reson. Med 9 (2001); 1 pg.

D. Ballon and K. L. Meyer; :Two-Dimensional Ladder Network Resonators; Journal—Journal of Magnetic Resonance, Series A 111, (1994); pp. 23-28 (6 pgs.).

D.I. Hoult, B. Tomanek; Use of Mutually Inductive Coupling in Probe Design; Article; 2002; pp. 262-285; vol. 15(4); Wiley Periodicals, Inc.

* cited by examiner

HIGH-PASS TWO-DIMENSIONAL LADDER NETWORK RESONATOR

CROSS-REFERENCE TO RELATED PATENT APPLICATIONS

This patent application claims the benefit of U.S. Provisional Patent Application No. 60/671,597, filed Apr. 15, 2005, the entire disclosure of which is incorporated by reference in their entirety herein.

STATEMENT REGARDING FEDERALLY SPONSORED RESEARCH AND DEVELOPMENT

This invention arose out of research sponsored by the National Institute of Biomedical Imaging and Bioengineering, Grant No. RO1EB02070. The U.S. government may have certain rights to this invention.

FIELD OF THE INVENTION

This invention pertains to radio frequency resonators, and more particularly, to a ladder network radio frequency resonator.

BACKGROUND OF THE INVENTION

Magnetic resonance imaging (MRI) is used to produce high resolution images of the interior of the body (e.g., humans, animals, etc.) for such purposes of medical research, medical diagnosis, etc. The images are produced based on the absorption and emission of energy in the radio frequency range of the electromagnetic spectrum.

Typically, magnetic resonance imaging is performed by placing a patient in a constant magnetic field, $B_0$. A radio frequency excitation pulse ($B_1$ field) is then transmitted into the patient. The excitation pulses cause magnetic moments of hydrogen nuclei to absorb energy. Upon removal of the excitation pulses, the nuclear moments begin to emit their absorbed energy and realign with the constant magnetic field, $B_0$. During this realignment period, the nuclear moments emit radio frequency signals characteristic of the magnetic field and of the particular chemical environment in which the nuclei exist.

An RF coil may be used to both transmit the excitation pulses and receive the signals from the nuclei. Alternatively, one RF coil may be used to transmit the excitation pulses and another separate coil to receive the signals from the nuclei.

Multi-element radiofrequency resonator designs provide superior sensitivity for anatomical structures near the surface of the body and have utility for parallel imaging applications. One type of multi-element radiofrequency resonator design is known as a two-dimensional ladder network resonator. The general problem of two-dimensional ladder network resonators has been shown to be closely related to the problem of a vibrating mechanical membrane with suitable boundary conditions. This problem is most easily solved by writing down a recursion relation for Kirchhoff's voltage equations on the meshes of the structure of interest. The dispersion relation for the eigenvalues yields the frequency spectrum, while the eigenfunctions represent the mesh current amplitudes. From the eigenfunctions it is straightforward to calculate $B_1$ maps.

U.S. Pat. Nos. 5,515,855 and 5,682,893 to Meyer et al. provide an example of low-pass two-dimensional ladder networks. The low-pass two-dimensional ladder networks provide a doubly degenerate homogeneous mode for circularly polarized magnetic resonance imaging applications. Further details can be found in the articles entitled "Two Dimensional Ladder Network Resonators," Ballon et. al., Journal of Magnetic Resonance, Series A 111, 23-28 (1994) and "A 3×3 Mesh Two Dimensional Ladder Network Resonator for MRI of the Human Head," Meyer et al., Journal of Magnetic Resonance, Series B 107, 19-24 (1995), the contents of which are incorporated herein by reference.

One of the primary disadvantages of the low-pass structures is that higher field applications of these structures are limited by the fact that the eigenvalue of the most homogeneous normal mode is lowest in frequency.

BRIEF SUMMARY OF THE INVENTION

The invention provides a high-pass two-dimensional ladder network resonator. In its most basic form, the high-pass two-dimensional ladder network is a collection of inductively coupled resonators where each element is represented by a plurality of conducting strips having a self-inductance L in a rectangular shape, circular shape, and the like (e.g., dome-shaped, trapezoidal shape, etc.), joined by a capacitor having a value C at one or more points along the conducting strips.

The next-to-highest eigenvalue of the network corresponds to a normal mode giving rise to $B_1$ fields with good spatial homogeneity above the resonator plane. In the strong coupling "eigenmode" limit of an inductively coupled two-dimensional resonator array, the array produces a high-frequency resonant mode that can be used to generate the traditional quadrature $B_1$ field, and in the limit of weak or zero coupling reduces to the familiar phased array suitable for parallel imaging applications.

The high-pass two-dimensional ladder network resonator structure can be shaped so the structure can be used in a variety of applications. The shapes for MRI applications include a blanket-type coil, a micro-coil, a body coil, an endo-coil, cylindrical coils including animal coils and head coils, and specialized coils such as hand coils, ankle coils, etc. The structure can also be used in credential card applications.

Either in conjunction with or independent of MRI applications, the structure of the inductively coupled high-pass two-dimensional ladder network resonator array can be used to reconstruct all the basis functions that are used to create an image. The collection of resonant modes (i.e., the eigenfunctions) of the array structure form a complete set of functions that allow any well-behaved function to be approximated across the structure. These functions can be described as Fourier components of an actual image. The steps to recreate an image include exciting the array at each resonant mode with the amplitude set to the magnitude of the Fourier coefficient corresponding to the eigenfunction of the resonant mode. The amplitude in the array structure is recorded. The amplitude of the array structure corresponds to the Fourier coefficient. A Fourier transform is calculated using the recorded amplitudes, resulting in the image that was being created. If the structure is excited with all the resonant modes at once (i.e., in parallel) or sequentially in rapid fashion, the array structure can be used as an imaging device.

Other aspects, objectives and advantages of the invention will become more apparent from the following detailed description when taken in conjunction with the accompanying drawings.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

The invention provides a high-pass two-dimensional ladder network where the next-to-highest eigenvalue corresponds to a normal mode giving rise to $B_1$ fields with good spatial homogeneity above the resonator plane. As such, it can be utilized for linear or quadrature operation with a $B_1$ profile suitable for imaging applications and security applications.

Figure 1:
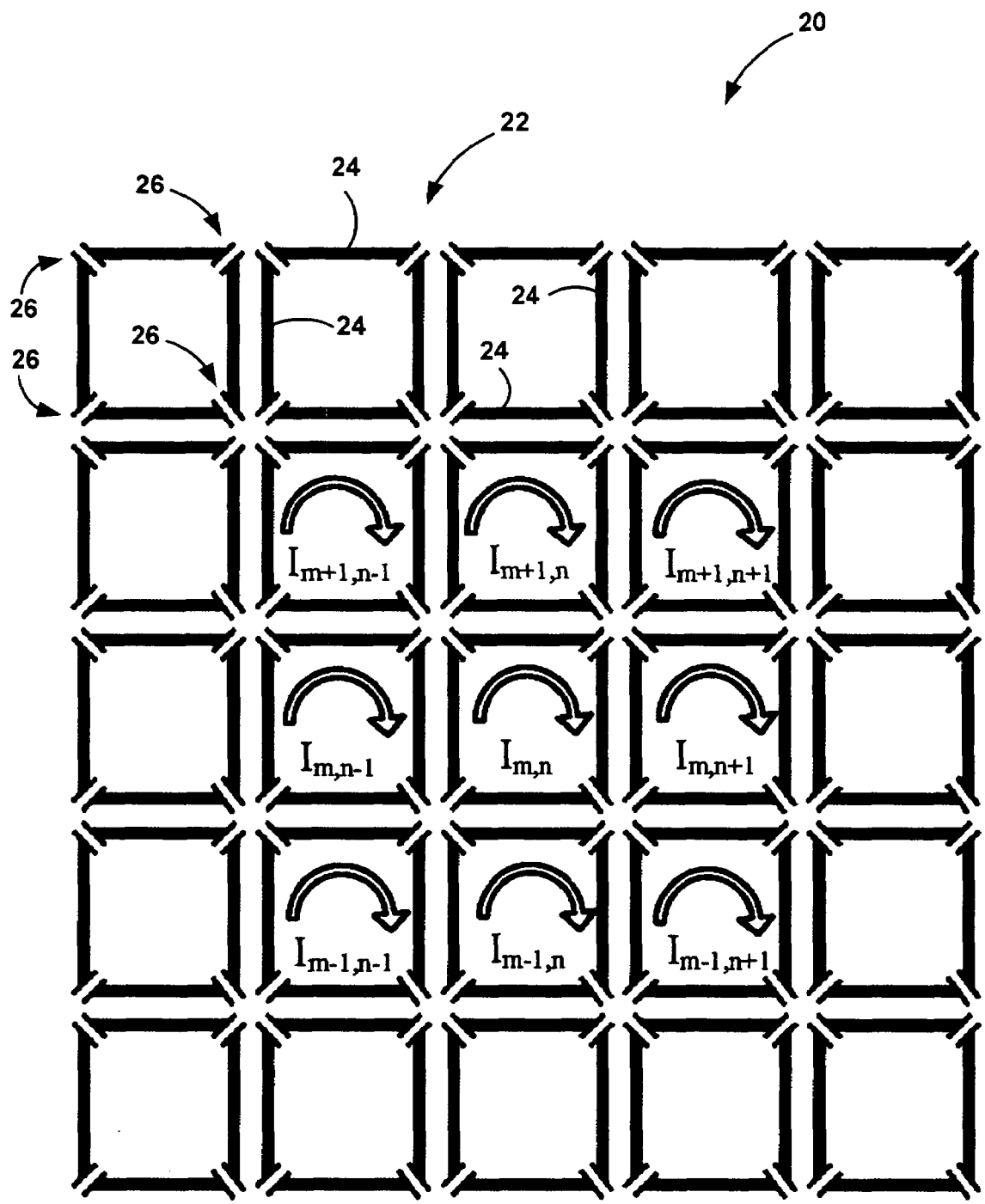
FIG. 1 is an illustration of a 5×5 square mesh high-pass two-dimensional ladder network in accordance with the teachings of the present invention.

Turning now to the figures, wherein like reference numerals refer to like elements, an embodiment of the invention is illustrated in FIG. 1. The high-pass two-dimensional ladder network 20 of FIG. 1 is shown as a 5×5 collection of inductively coupled resonators. The resonators are only inductively coupled and do not share any common leg between resonators and may partially overlap other resonators. Each resonator 22 in FIG. 1 is represented by conducting strips 24 having a self inductance L, joined by a capacitor 26 having a capacitance having a value C at each corner. In some applications, the capacitance value may be non-uniform in the network 20, or be located at different points along each individual resonator, or be located at as few as one or more than four points along each resonator. When the capacitors 26 are distributed around a square shaped resonator, the capacitive coupling to nearby objects is further limited when compared to a single capacitor. The size of each resonator does not have to be the same size as other resonators in the array of resonators.

Figure 2:
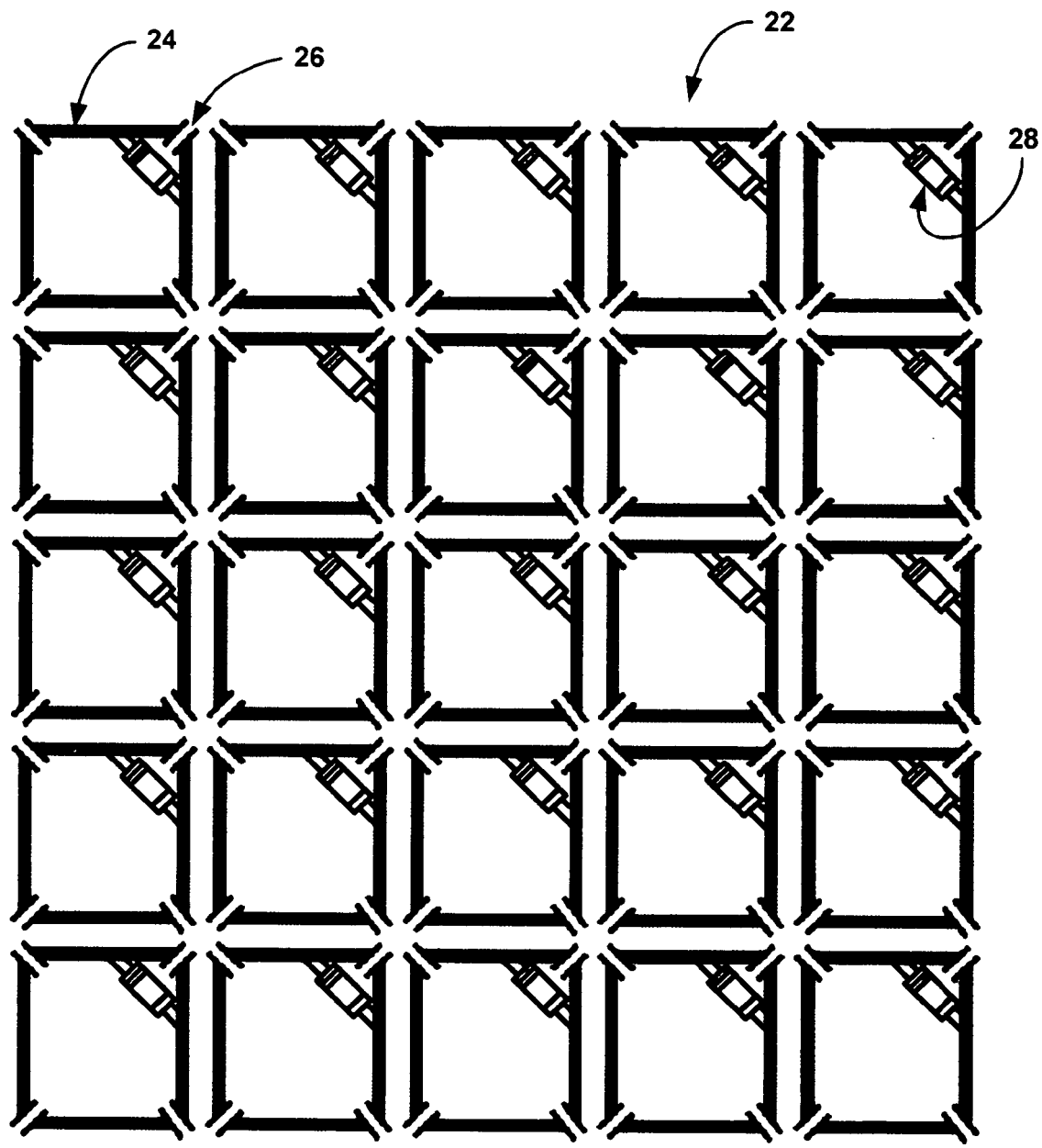
FIG. 2 is an illustration of a prototype of an inductively coupled planar 5×5 square mesh high-pass two-dimensional ladder network resonator in accordance with the teachings of the present invention.
Figure 3:
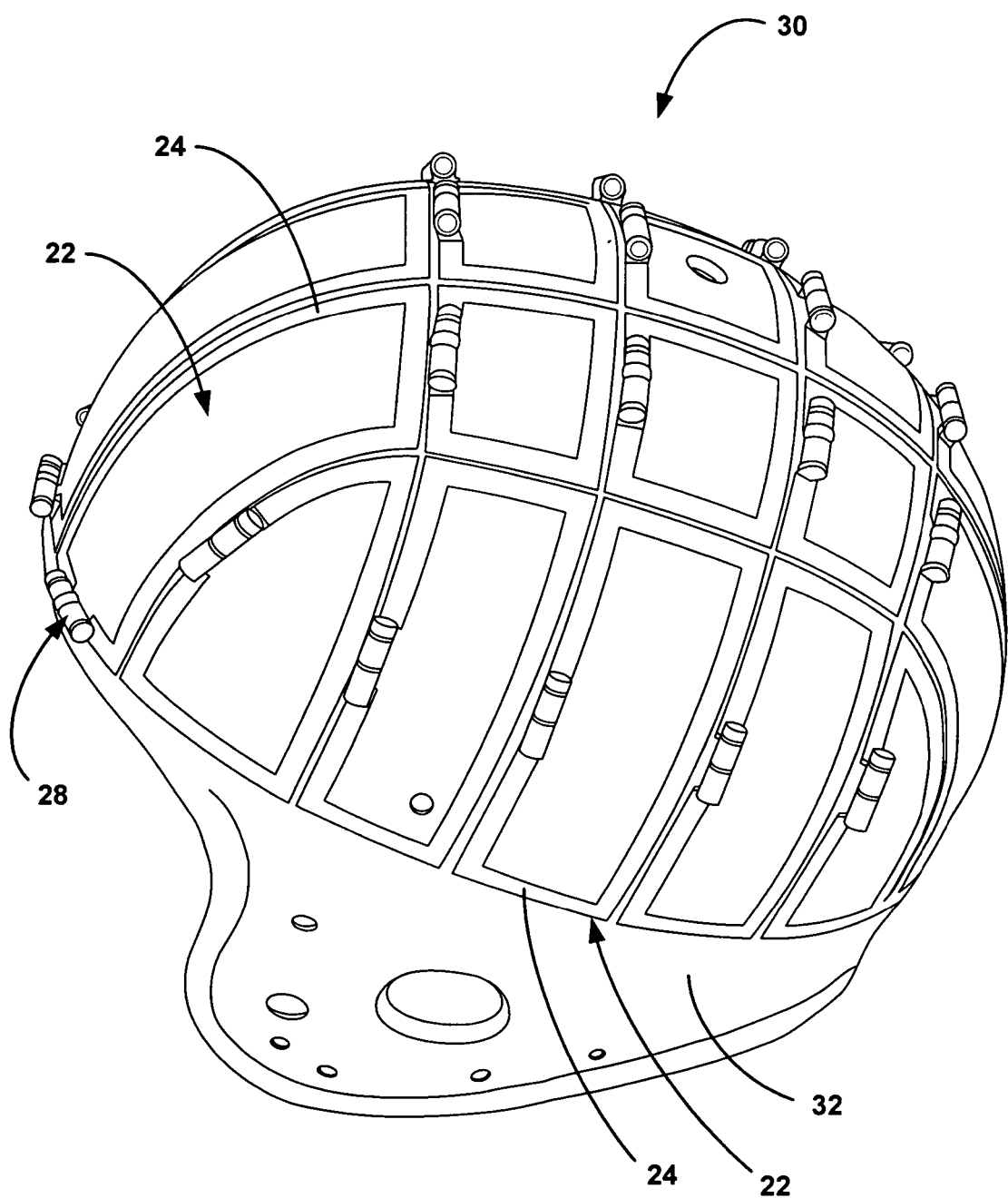
FIG. 3 is an illustration of a prototype of an inductively coupled high-pass two-dimensional ladder network resonator in a head coil configuration in accordance with the teachings of the present invention.

While the resonator shape is shown in FIG. 1 as a rectangular shape, the shape may be any shape, such as for example and not limitation, dome-shaped, trapezoidal shape, triangular shaped etc. For example, FIG. 2 shows a perspective view of a prototype of an inductively coupled planar 5×5 square mesh high-pass two-dimensional ladder network resonator. FIG. 3 is a perspective view of a prototype of an inductively coupled high-pass two-dimensional ladder network resonator 30 for use in head imaging. The prototype of FIG. 3 shows a single conducting strip with the ends located at or near the middle of a leg of the resonator with a tuning capacitor 28 between the ends with the conducting strip mounted on a helmet 32. Additionally, the prototype of FIG. 3 shows different shaped and sizes of resonators. A head resonator used in a MR lab of a medical establishment (i.e., a production head resonator) uses capacitors 26 in place of trim capacitors 28 and the resonator elements 22 are covered with a dielectric material of sufficient strength to protect the resonator elements 22 from continual handling. The helmet 32 of the head resonator 30 has different sizes. For example, it is sized for neonatal, pediatric, and adult sized heads.

The Kirchoff equations for the voltage on the meshes of FIG. 2 lead to a recursion relation. The recursion relation can be written as $$\left(\omega L - \frac{1}{\omega C}\right) I_{m,n} - \kappa \omega L(I_{m+1,n} + I_{m,n-1} + I_{m-1,n} + I_{m,n-1}) - \alpha \omega L(I_{m+1,n+1} + I_{m-1,n+1} + I_{m-1,n-1} + I_{m+1,n-1}) = 0$$

where the constants $\kappa$ and $\alpha$ represent the coefficients of mutual inductance between nearest neighbors having parallel legs and those on the diagonal respectively. In one embodiment, $0 \leq \kappa + \alpha < \frac{1}{4}$. The $I_{m,n}$ are the current amplitudes in the m,nth element.

To obtain a dispersion relation, it is assumed that the eigenfunctions obey fixed edge boundary conditions (i.e., it is assumed that $I_{0,n} = I_{m,o} = I_{M+1,n} = I_{m,N+1} = 0$. If $\Omega$ and $\Gamma$ are defined as integers with $\omega = 1 \ldots M$, $\Gamma = 1 \ldots N$, trial eigenfunctions of the form $$I_{m,n}(\Omega, \Gamma) = A_{\Omega,\Gamma} \sin\frac{m\pi\Omega}{M+1} \sin\frac{n\pi\Gamma}{N+1}$$

yield the following dispersion relation:

$$\omega_{\Omega,\Gamma}^2 = \frac{1}{LC}\left(1 - 2\kappa\left(\cos\frac{\pi\Omega}{M+1} + \cos\frac{\pi\Gamma}{N+1}\right) - 4\alpha\cos\frac{\pi\Omega}{M+1}\cos\frac{\pi\Gamma}{N+1}\right)^{-1}$$

In the above equation, $\Omega$ and $\Gamma$ are the integral mode numbers and ultimately determine the homogeneity of the magnetic field produced by each of the eigenfunctions. In the weak coupling limit, $\kappa$ and $\alpha$ approach zero, and each element operates independently at the frequency $\omega = (LC)^{-1/2}$ as expected. In the strong coupling limit, $\kappa$ and $\alpha$ are non-negligible and the individual circuit elements combine to produce normal modes of oscillation. Additionally, the circuit as a whole exhibits a high-pass behavior in that the lowest mode numbers corresponding to the most homogeneous eigenfunctions appear at the highest frequencies. The dispersion relation for the 5×5 resonator of FIG. 1 with negligible diagonal coupling ($\alpha$=0) is shown in FIG. 4a.

Figure 4A:
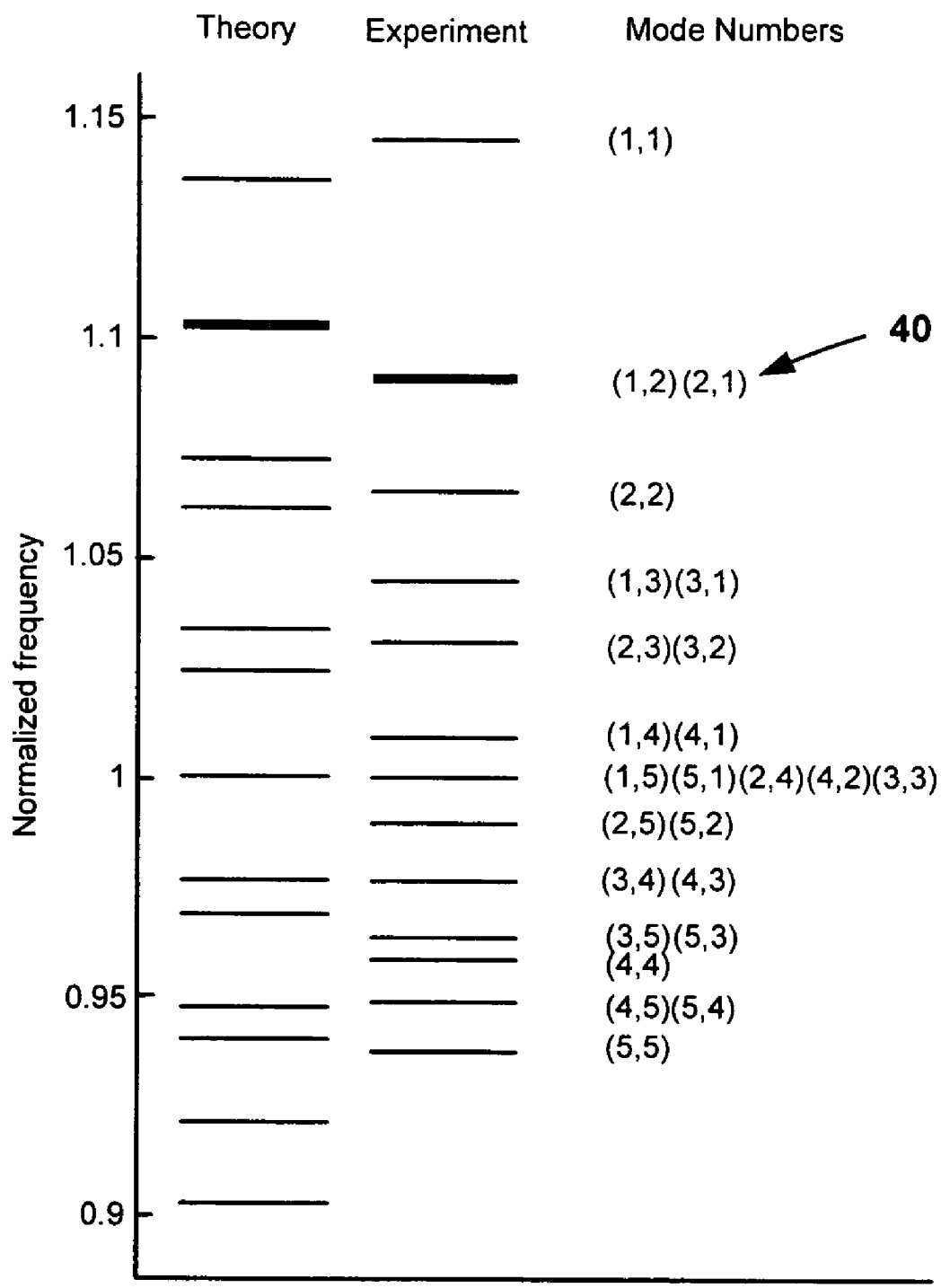
FIG. 4a is a graph illustrating the theoretical and experimental eigenvalues for the planar 5×5 ladder network of FIG. 2.

Turning now to FIG. 4a, the theoretical and experimental eigenvalues for a 5×5 inductively coupled planar array is shown. The frequency scale is normalized to the single element frequency $\omega = (LC)^{-1/2}$. A total of 25 resonances exist, including ten doublets and five singlets. The general case of a resonator with N×N elements will yield $N^2$ resonances with N(N-1)/2 doublets and N singlets. The (1,5)(5,1) and (2,4)(4,2) doublets are further degenerated with the (3,3) singlet due to the neglected diagonal coupling. The next-to-highest eigenvalues, the (1,2)(2,1) doublet 40, appearing at the next-to-highest frequency, corresponds to a normal mode giving rise to $B_1$ fields with good spatial homogeneity above the resonator plane. As a result, the (1,2)(2,1) doublet 40 yields a mode suitable for quadrature operation and has a $B_1$ profile suitable for imaging. It is important to note that other eigenmodes may be used for imaging as well with varying degrees of homogeneity for the spatial sensitivity. Some of these modes can be used in quadrature similar to the (1,2) or (2,1) pair.

Figure 4B:
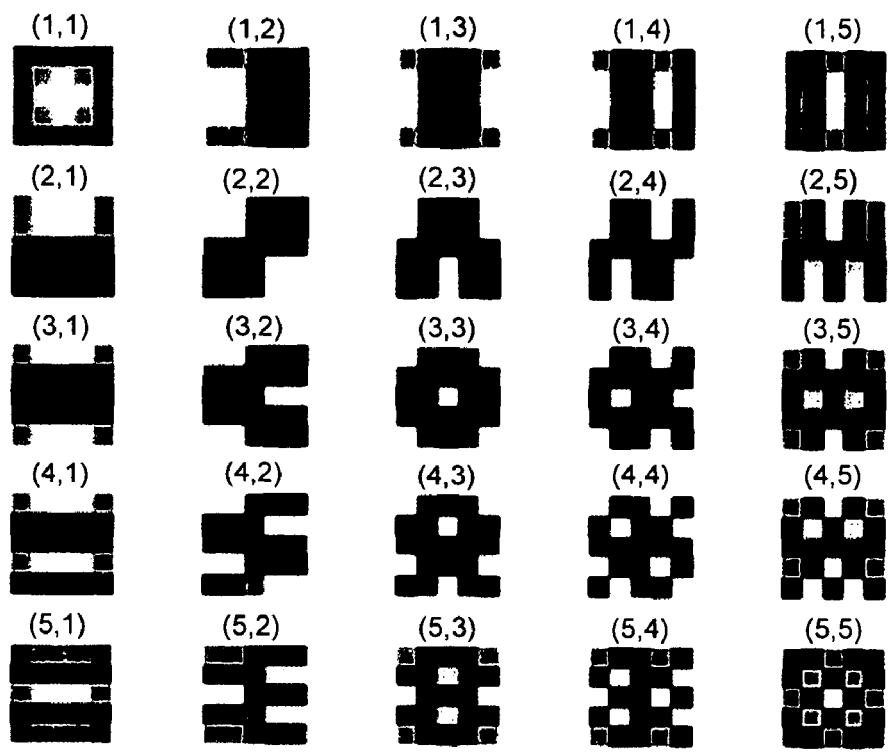
FIG. 4b illustrates the complete set of 25 eigenfunctions for the planar 5×5 ladder network of FIG. 2.
Figure 4C:
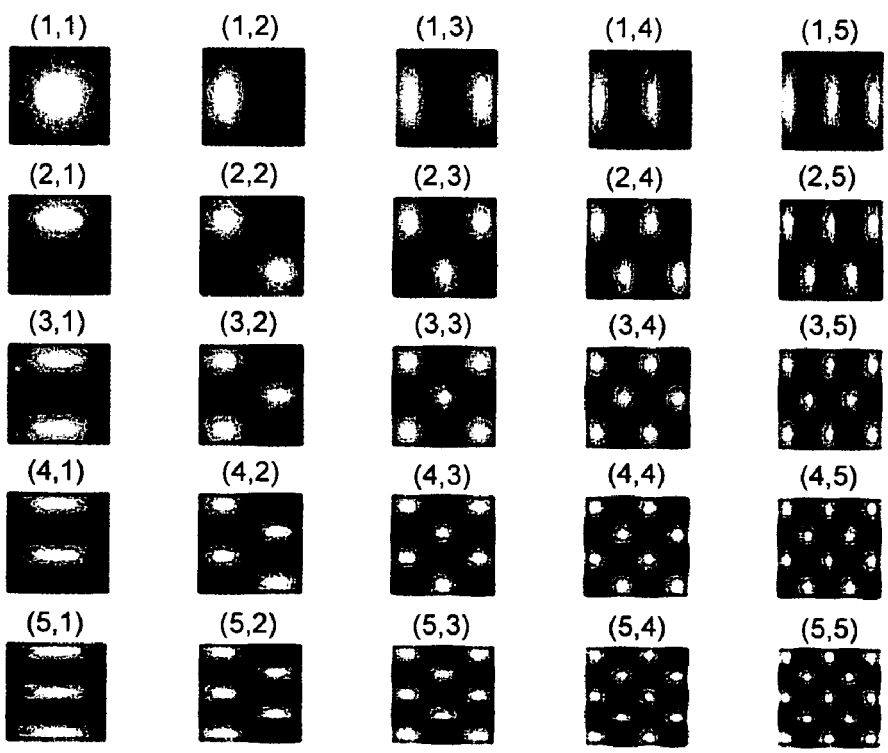
FIG. 4c illustrates the first 25 eigenfunctions for a 30×30 array.

Several normal modes for two representative arrays are shown in FIG. 4a-c. In FIG. 4b, the complete set of 25 modes for a 5×5 lattice structure is shown. Dark values correspond to negative currents and bright values correspond to positive currents. In FIG. 4c the lowest 25 modes of a 30×30 array are shown to better illustrate the eigenfunctions. The eigenfunctions provide the relative amplitude of currents across the structure for each resonator element. For each mode, the amplitudes are used to create a $B_1$ profile. In the continuum limit, the current distribution field becomes a superposition of harmonic waves.

Figure 5A:
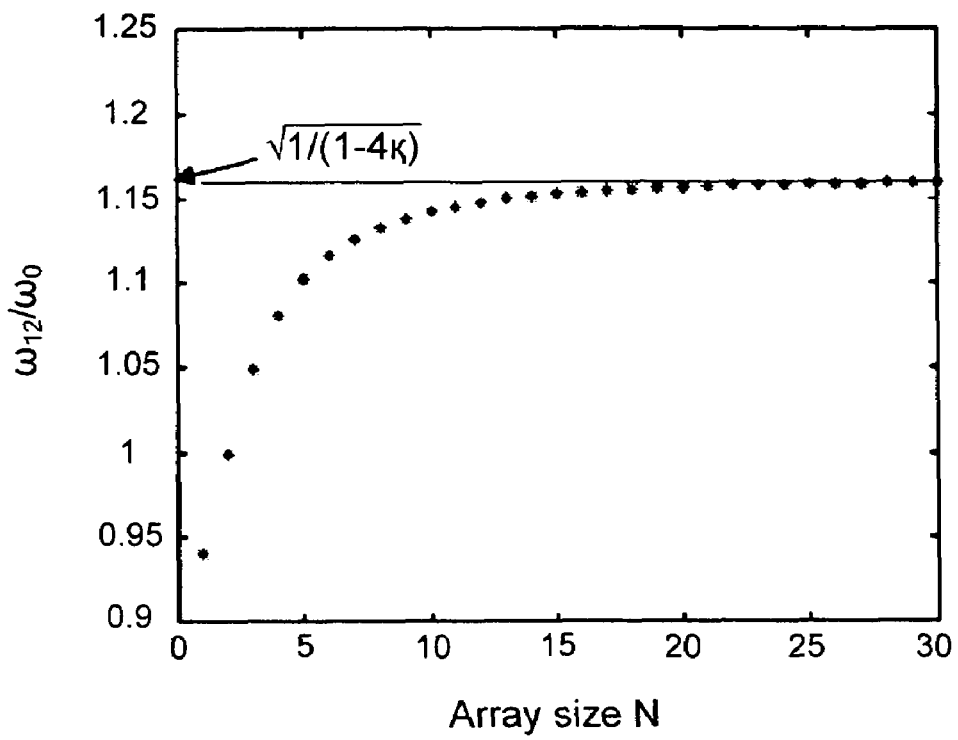
FIG. 5a illustrates an imaging mode resonant frequency to single element resonant frequency as a function of the array size for a fixed coupling of $\kappa=0.065$, $\alpha=0$.
Figure 5B:
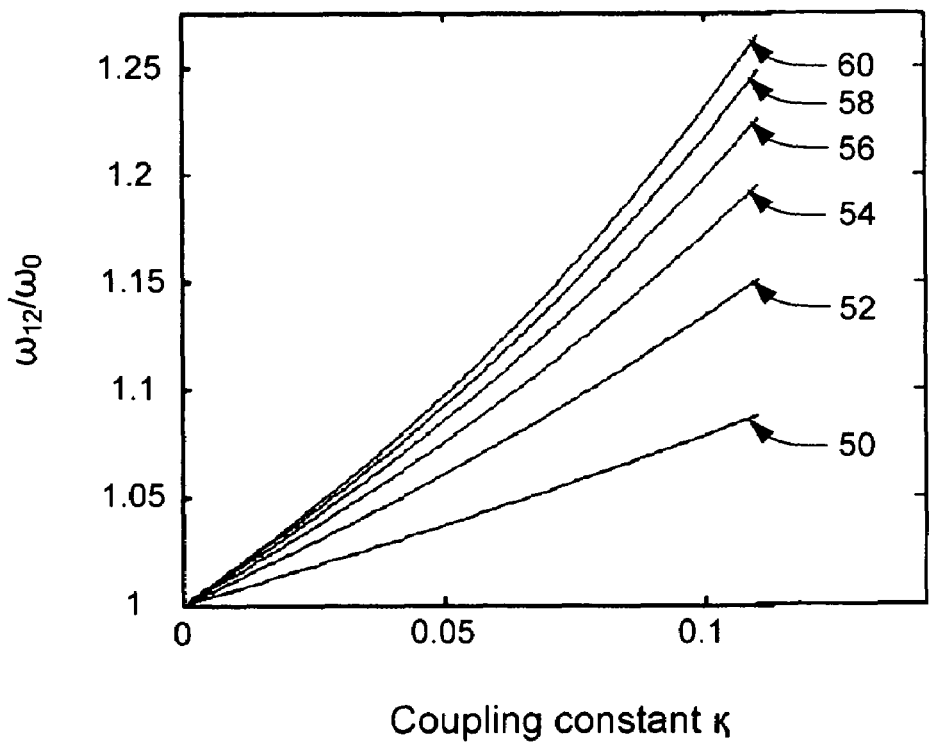
FIG. 5b is a graph illustrating $\omega_{1,2}/\omega_0$ as a function of the coupling constant $\kappa$ for various size arrays.

Note also that as the matrix size increases, the ratio of the "imaging mode" to the single element resonant frequency, $\omega_{1,2}/\omega_0$, increases but eventually converges asymptotically to $\sqrt{1/(1-4\kappa)}$ as shown in FIG. 5a, thus potentially making it more difficult to isolate the imaging mode from the increasing number of modes. As the coupling increases, this ratio increases as well as shown in FIG. 5b. In FIG. 5b, line 50 corresponds to a 3×3 array, line 52 corresponds to a 4×4 array, line 54 corresponds to a 5×5 array, line 56 corresponds to a 6×6 array, line 58 corresponds to a 7×7 array, and line 60 corresponds to an 8×8 array. To increase the field homogeneity in high-field imaging, one strategy would be to increase the matrix size as well as the coupling between the elements. As the matrix size increases, the current distribution stays qualitatively the same (see, e.g., FIG. 4c) and asymptotically approaches a continuous standing harmonic wave.

Figure 6A:
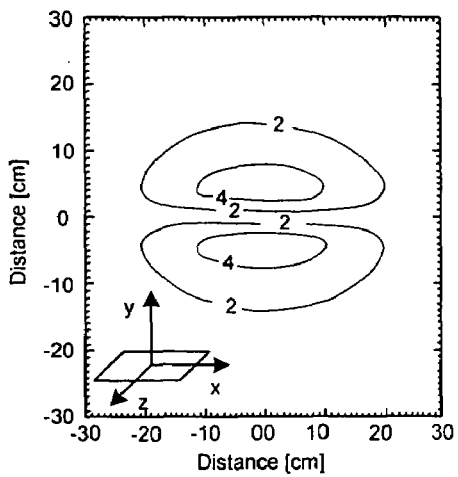
FIG. 6a is a $B_1$ map of the (1,2) mode of the planar resonator of FIG. 2 with x=0 cm.
Figure 6B:
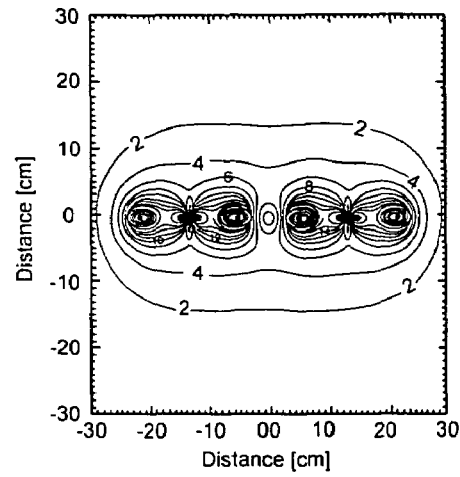
FIG. 6b is a $B_1$ map of the (1,2) mode of the planar resonator of FIG. 2 with z=0 cm.
Figure 6C:
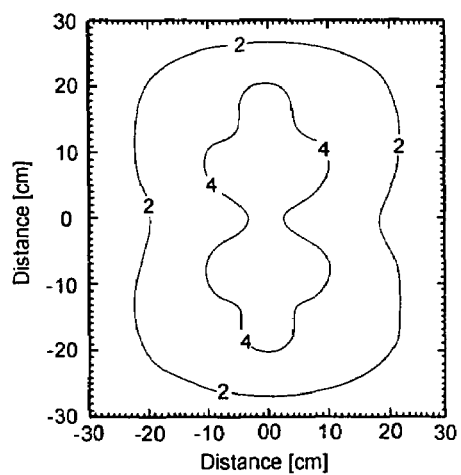
FIG. 6c is a $B_1$ map of the (1,2) mode of the planar resonator of FIG. 2 with y=7.5 cm.
Figure 6D:
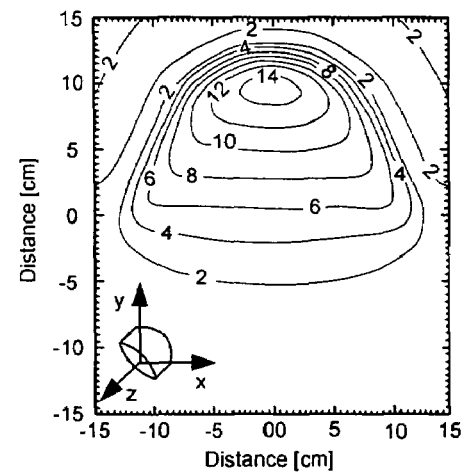
FIG. 6d is a $B_1$ map of the (1,2) mode of the head resonator of FIG. 3 with x=0 cm.
Figure 6E:
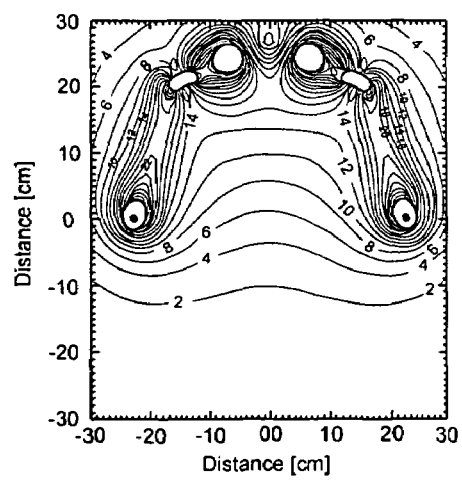
FIG. 6e is a $B_1$ map of the (1,2) mode of the head resonator of FIG. 3 with y=0 cm.
Figure 6F:
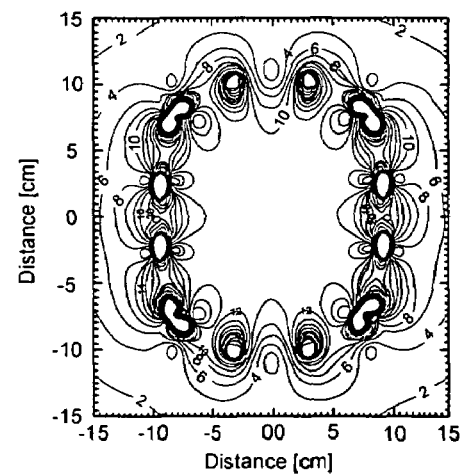
FIG. 6f is a $B_1$ map of the (1,2) mode of the head resonator of FIG. 3 with z=−6 cm.

5×5 mesh inductively coupled planar and head resonators were constructed for magnetic resonance imaging and tested at an operating frequency of 128 MHz (3 Tesla magnetic field strength). B1 field simulations for the (1,2) or (2,1) mode of the structures exhibited a field suitable for imaging in this application. FIGS. 6a-6c show the simulations for the (1,2) mode of the planar resonator with x=0 cm in FIG. 6a, z=0 cm in FIG. 6b, and y=7.5 cm in FIG. 6c. FIGS. 6d-6f show simulations for the (1,2) mode of the head resonator with x=0 cm in FIG. 6d, y=0 cm in FIG. 6e, and z=-6 cm in FIG. 6f.

For the planar array, each element was tuned to a resonant frequency of 117.0 MHz and had dimensions of 8×8cm with C=40 pF. Adhesive backed copper tape was used to form the elements on 1 mm thick Teflon substrates. Tuning was performed by trim capacitors, one on each mesh and parallel to the 40 pF capacitors, on the isolated elements to avoid resonance shifts due to coupling with neighboring elements. The experimental eigenvalues are compared with the theoretical values in FIG. 4a.

Figure 7:
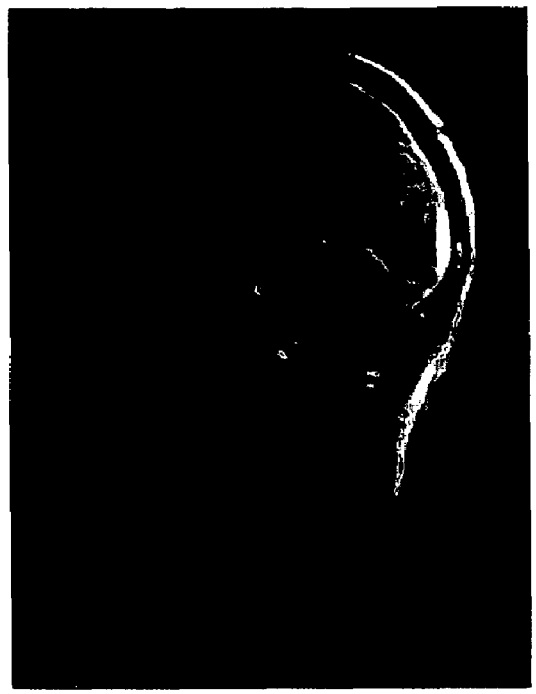
FIG. 7 is a sagittal gradient echo head image obtained with the planar network of FIG 2.

An image acquired using the planar array prototype is shown in FIG. 7 The imaging parameters were TR=75 ms, TE=1.7 ms, and a 5 mm slice thickness. The total scan time for 21 slices was 30 seconds. Outside of the five-fold degeneracy at the single element resonance frequency, all modes can be identified by using a small pickup coil connected to a network analyzer and an oscilloscope by measuring the relative field amplitudes across the structure.

Figure 8:
FIG. 8 is a sagittal fast spin echo brain image obtained in quadrature with the inductively coupled head array of FIG. 3.

The head array was constructed on a hemispherical substrate 22 cm in diameter and 13 cm deep. However, each resonator element 22 had only one capacitor in the center of one leg. During tuning, all meshes but one were shorted to avoid resonance shifts due to coupling between meshes with the process repeated for all meshes. Images of the superior aspect of the human brain as shown in FIG. 8 were obtained from the (1,2)(2,1) doublet operating in a quadrature transmit/receive mode. Imaging parameters were TR=2000 ms, TE=69 ms, THK=3 mm, and ETL=8. The total scan time was 4 minutes and 20 seconds.

An interesting point regarding the head array was that the (1,2)(2,1) doublet in the eigenmode limit occurred at a frequency more than 15% higher than the single element resonance, and was a strongly varying function of the coupling constant κ as indicated in FIGS. 5*a* and 5*b*. Note that it is in principle straightforward to increase the operating frequency of this design by decreasing the size of the individual elements. These properties may therefore be useful for high-field applications.

As previously indicated, the resonator may be any shape, such as for example and not limitation, dome-shaped, trapezoidal shape, triangular shaped etc. The high-pass two-dimensional ladder network may also be in any shape such as a body coil, animal coil, specialty coil such as hand, ankle, etc., animal coil, micro-coil, and endo-coil. In FIG. 3, and FIGS. 9-13, trim capacitors 28 are used to tune the resonant frequency of the prototypes to a desired frequency. The trim capacitors 28 are placed on each resonator element 22 and parallel to the capacitors 26. In a production environment, only the capacitors 26 are needed. Alternatively, trim inductors may be used to tune a frequency by adding/subtracting inductance from the resonator element 22.

Figure 9:
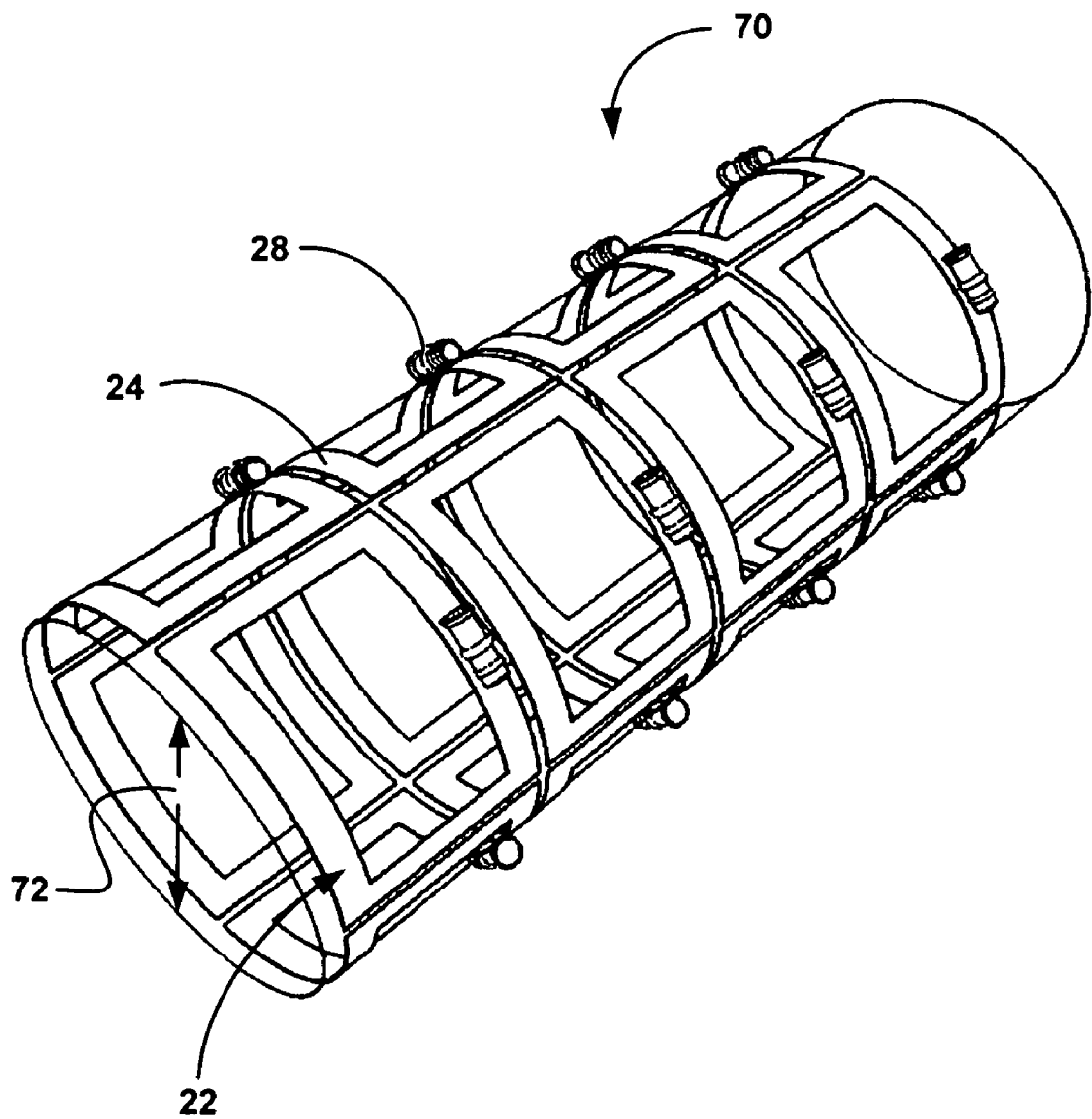
FIG. 9 illustrates a perspective view of a prototype of an inductively coupled high-pass two-dimensional ladder network resonator in a body coil configuration in accordance with the teachings of the present invention.
Figure 10:
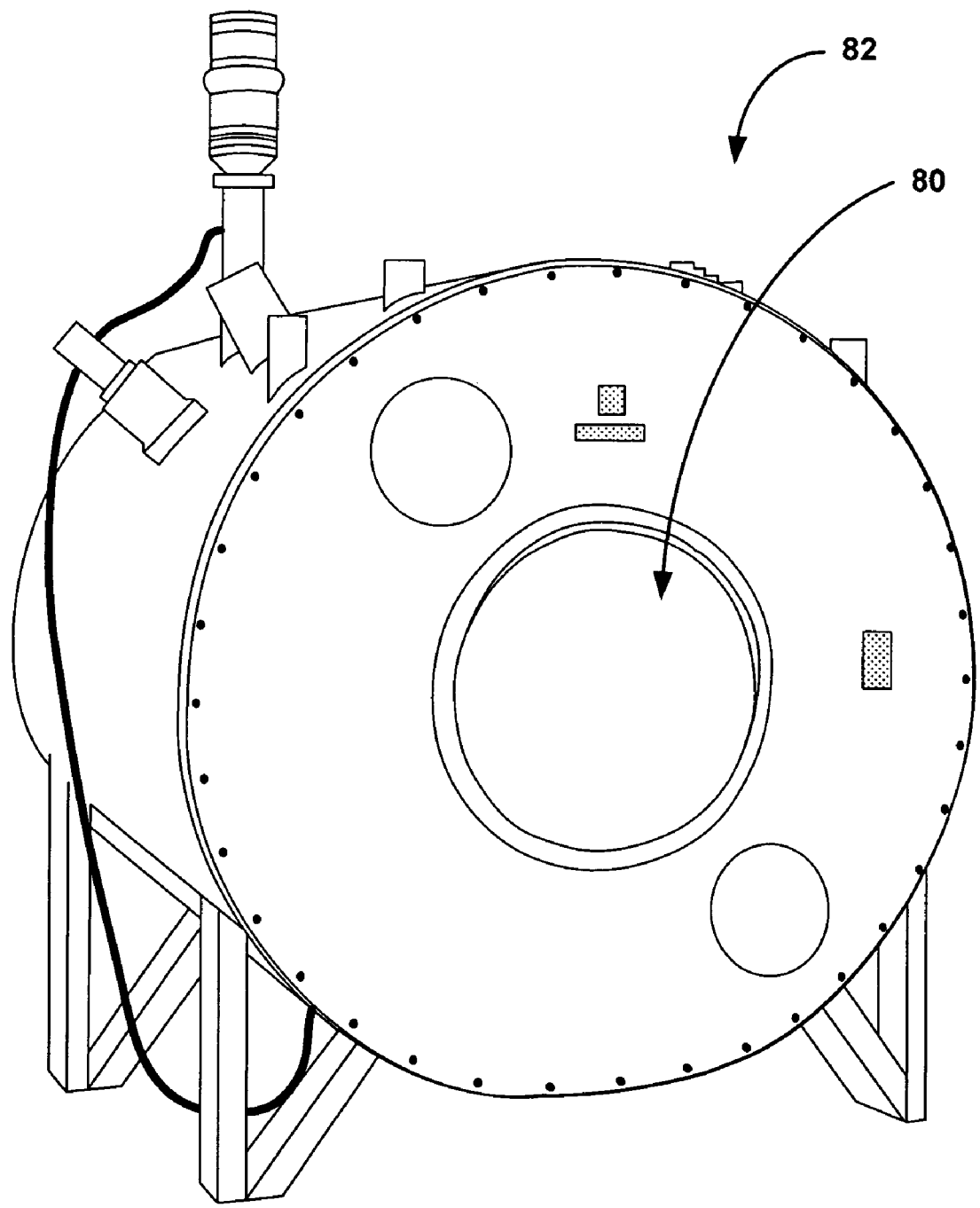
FIG. 10 shows an illustration of a MRI machine with the outer cover off indicating approximately where the body coil of FIG. 9 is mounted.

FIG. 9 shows a prototype of a body coil 70 used to demonstrate proof of concept. The body coil consists of a plurality of resonator elements 22 formed into a cylindrical shape. In production, the internal diameter 72 of the body coil is larger than the patient opening 80 of an MRI machine 82 (see FIG. 10) such that the body coil 70 can be mounted within the MRI machine 82. The body coil 70 is built into most MRI equipment and functions both as a transmit and receiver coil for a basic scan. This coil has a large measurement field, but does not have the high SNR of special coils. When specific receiver only coils are used (i.e., surface coils), the body coil 70 can serve as the transmit coil. Alternatively, the body coil 70 may have an internal diameter 72 that is large enough such that the body coil 70 fits around a patient. The minimum number of resonator elements 22 in a body coil 70 is limited due to physical constraints. As previously indicated, the conductive strips have a self-inductance L. As the periphery of a resonator element increases, the self-inductance of the conducting strips increases. In order to operate at the same frequency, a resonator element with a large periphery must have a smaller value of capacitance.

Figure 11A:
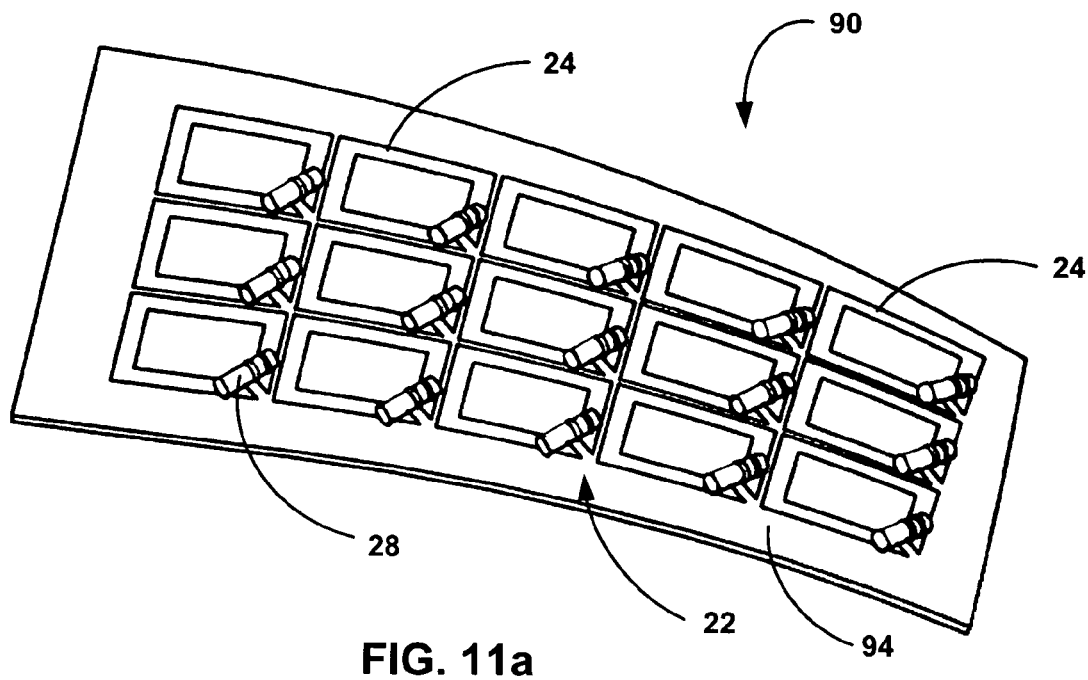
FIG. 11a illustrates a perspective view of a prototype of an inductively coupled high-pass two-dimensional ladder network resonator configured as a flexible coil that can be used as a blanket coil in accordance with the teachings of the present invention.
Figure 11B:
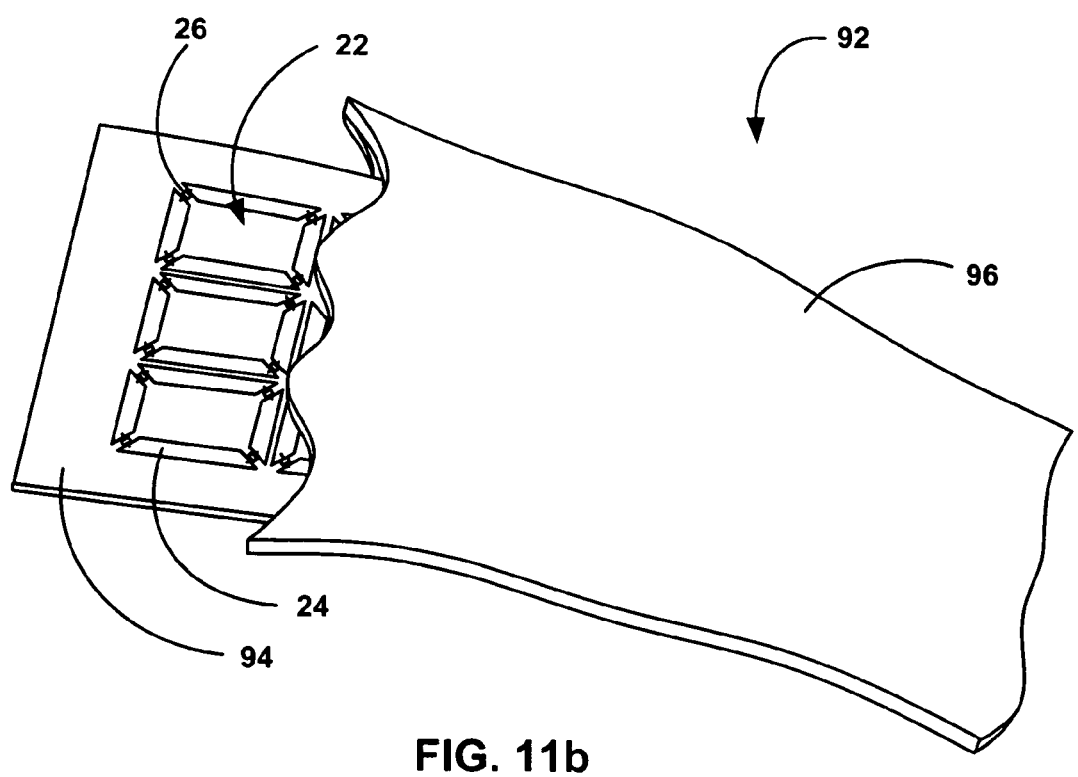
FIG. 11b shows an illustration of the flexible coil with covering in accordance with the teachings of the present invention.

FIG. 11*a* shows a prototype of a flexible coil 90 that can be used in a blanket coil. FIG. 11*b* shows an illustration of a blanket coil 92. A principle benefit of the blanket coil is that the sensitivity increases the closer a coil is to the body. The blanket coil can be form fitting, as opposed to a rigid cylinder which necessarily is some distance away from the body. The material 94 is rigid enough to protect the embedded resonator elements 22 (i.e., conductive strips 24 and capacitors 26) while holding its shape but flexible enough to be form fitting to allow the blanket coil 92 to fit over various body parts. The cover 96 of the blanket coil 92 electrically insulates the body from the elements 22.

Figure 12:
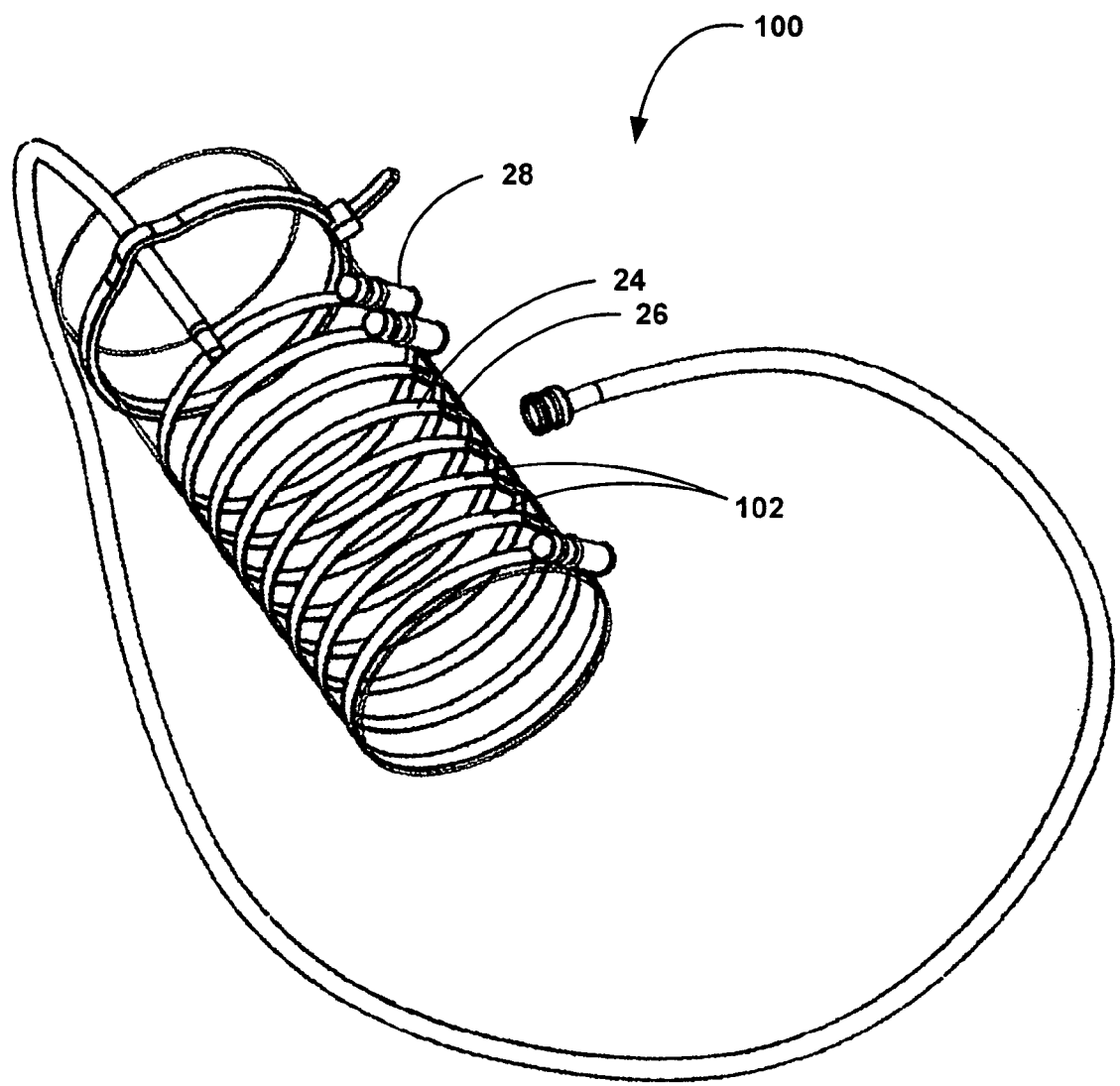
FIG. 12 illustrates a perspective view of a prototype of an inductively coupled high-pass two-dimensional ladder network resonator in an animal coil configuration in accordance with the teachings of the present invention.

Turning now to FIG. 12, the interest in small-animal imaging has been growing exponentially. The reason, paradoxically, is a revolution in human imaging: these techniques are no longer limited to simply mapping the internal anatomy. Because probes—like drugs—can be tested more easily in animals than in people, imaging research requires scanners able to see fine detail in rats, mice, and rabbits. Clinical MRI systems, for example, can see features about 1 cubic millimeter in size. In a small animal like a mouse, that volume occupies a lot of the mouse brain. Much finer detail is now within reach of virtually all types of imaging systems. MRI, for example, uses a combination of strong magnetic fields and radio waves to make certain atomic nuclei in a sample, typically those of protons in water, resonate and reveal their location. By boosting these magnetic fields and using advanced software algorithms, the resolution in animal systems has improved to about 50 micrometers on a side, an 8000-fold reduction in volume.

Turning now to FIG. 12, a prototype of an animal coil 100 is illustrated. The animal coil 100 has a plurality of inductively coupled elements 102. In one embodiment, each element 102 comprises a single loop of conducting strips 24 with one or more capacitors 26 separating portions of the conducting strips 24 at various points around the loop. In the prototype, trim capacitors 28 are used for the purpose of trimming the resonant frequency of the animal coil 100 to a desired frequency. In production, the animal coil sizes range from 1 cm diameter/3 cm length, 2 cm diameter/5 cm length, 4 cm diameter/8 cm length, 6 cm diameter/12 cm length, and 8 cm diameter/16 cm length and the like in size.

Figure 13:
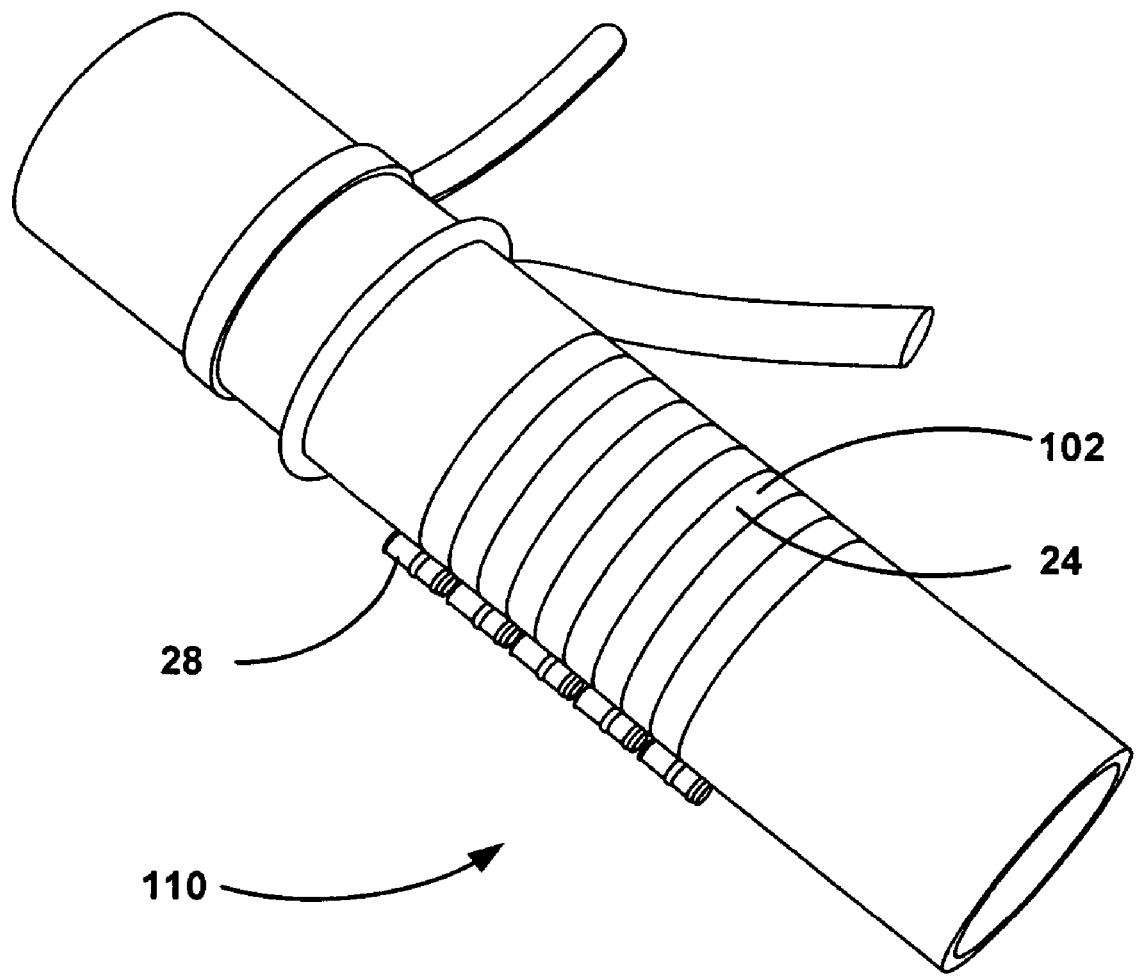
FIG. 13 illustrates a perspective view of a prototype of an inductively coupled high-pass two-dimensional ladder network resonator in a finger coil configuration in accordance with the teachings of the present invention.

FIG. 13 shows a prototype of a finger coil 110, which is smaller than the animal coil 100. Similar to the animal coil, the finger coil 110 has a plurality of inductively coupled elements 102. In one embodiment, each element 102 comprises a single loop of conducting strips 24 with one or more capacitors 26 separating portions of the conducting strips 24 at various points around the loop. Just like the animal coil prototype, the finger coil prototype uses a trim capacitor 28 in each element 102 for the purpose of trimming the resonant frequency of the finger coil 100 to a desired frequency.

Figure 14:
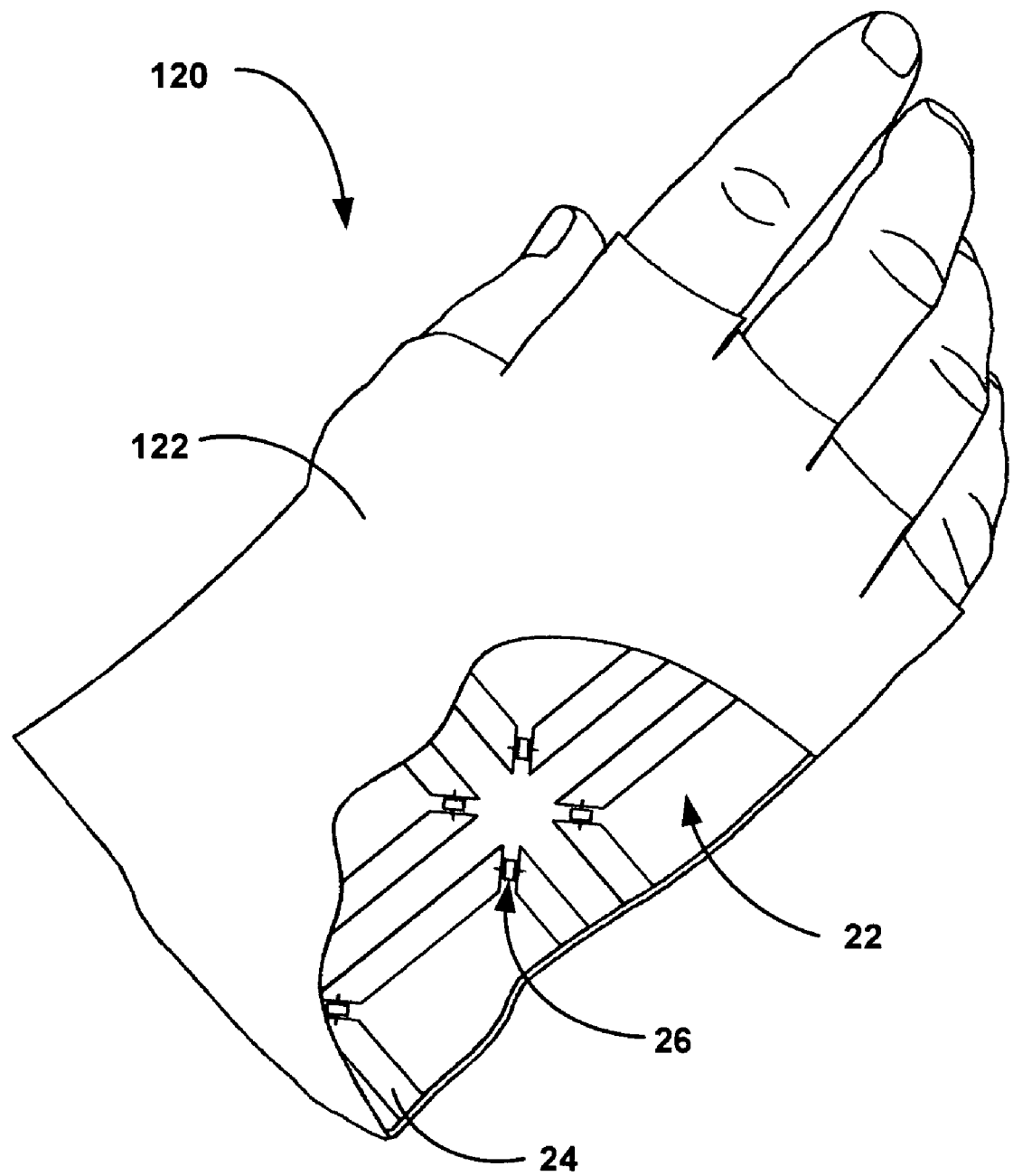
FIG. 14 shows an illustration of an inductively coupled high-pass two-dimensional ladder network resonator in a hand coil configuration in accordance with the teachings of the present invention.

FIG. 14 shows an illustration of a hand coil 120. In one embodiment, the hand coil 120 is similar to a fingerless glove. Alternatively, the hand coil 120 is configured as a band that fits over the hand. A plurality of inductively coupled resonator elements 22 or inductively coupled elements 102 are internal to the hand coil 120 and wrap around the hand. The resonators are protected by being covered with a suitable material 122. The hand coil 120 ranges in size from neonatal, pediatric, and adult sized hands.

Figure 15:
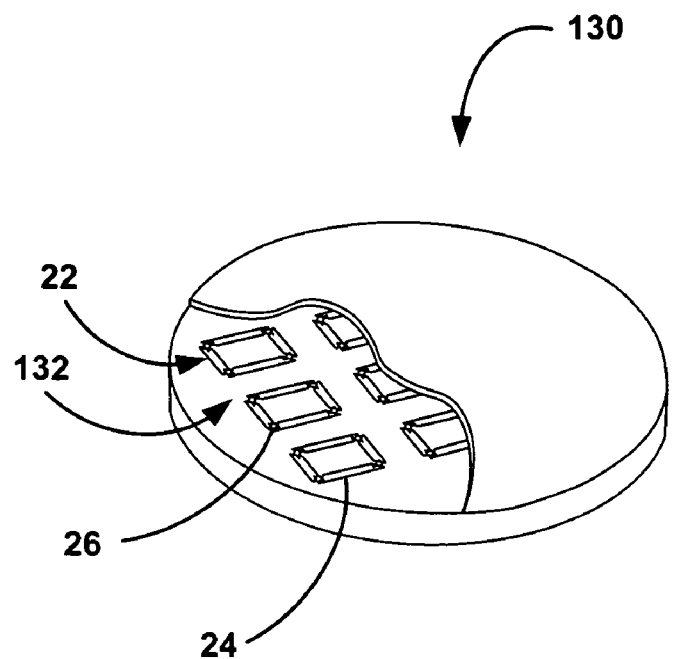
FIG. 15 shows an illustration of an inductively coupled high-pass two-dimensional ladder network resonator endo-coil in accordance with the teachings of the present invention.

FIG. 15 shows an illustration of an endo-coil 130. The endo-coil 130 is pill-sized (e.g., the size of a vitamin pill) and has a plurality of inductively coupled resonator elements 22 configured as a planar array 132. The conducting strips 24 and capacitors 26 of the resonator elements 22 are surface mounted to a flexible substrate. The flexible substrate and plurality of inductively coupled resonators are enclosed in a suitable biocompatible material as is known in the art. The endo-coil 130 may be either swallowed (e.g., taken as a pill) or inserted into the area of interest (e.g., in a spectroscopy procedure).

Figure 16:
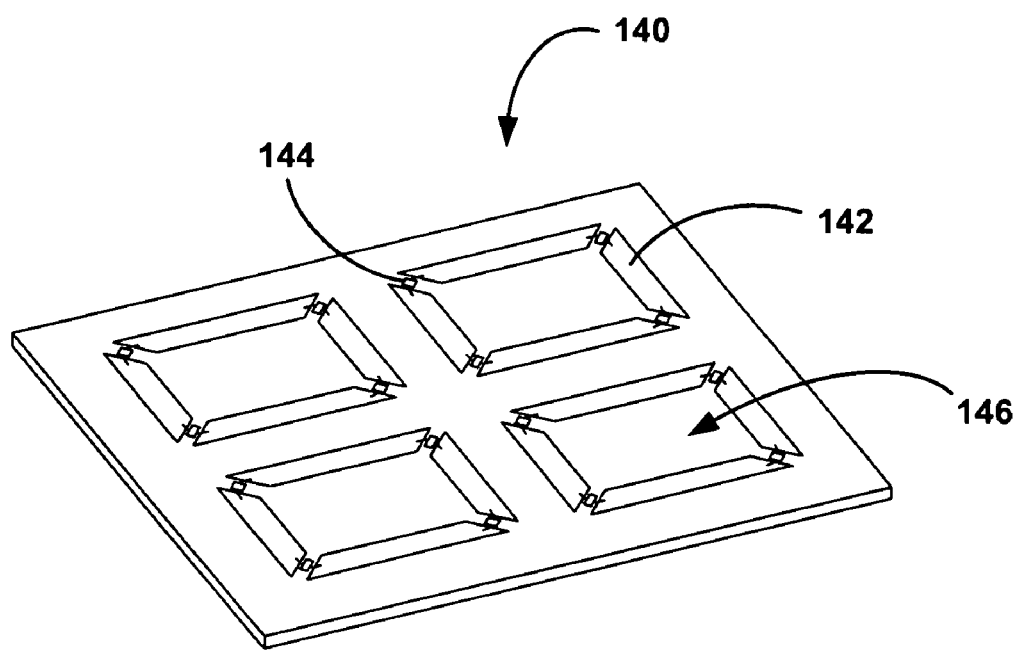
FIG. 16 shows an illustration of an inductively coupled high-pass two-dimensional ladder network resonator in a micro-coil configuration for cell imaging in accordance with the teachings of the present invention.

Turning now to FIG. 16, the limit of resolution of the human eye is about 100 micrometers (i.e., 100 microns (μm)). This limit has to do with the structure of the eye. The light microscope has a limit of resolution of 0.2 μm (or 200 nanometers). This limit is due to the wavelength of visible light itself. Although modern microscopes are capable of producing high resolution images at high magnifications, such a capability is worthless without sufficient contrast in the image. For many specimens, especially living ones, contrast is so poor that the specimen remains essentially invisible regardless of the power of the microscope. The most common way to increase contrast is to kill the specimen, then to fix and stain it. Living specimens can be viewed if fluorescent molecules are added to them. However, these molecules often interfere with the cell's function to a certain extent. Similarly, the electron microscope (EM) has a limit of resolution of about 2 nm. This resolution limitation is due to limitations of the lens used to focus electrons onto the sample. With an EM, remnants of dead cells, after fixation and heavy metal ion staining can be seen. Electrons are scattered as they pass through a thin section of the specimen, and then detected and projected onto an image on a fluorescent screen. Clinical MRI scans typically image a cube (voxel) of tissue 1×1×1 mm in size. While this is more or less satisfactory with respect to general human anatomy, a 1 mm cube is not sufficient. As a result, if one wants to clearly see the interior of a cell, a resolution is needed that is much, much finer. As discussed above, currently, MR microscopy can take images with voxels that are 50 μm on a side in live animals, and with voxels of 10 μm on a side in dead, fixed specimens used in cellular imaging. To see details inside a human cell, voxels of 1 μm or less on a side are needed. It is recognized that at this level of resolution the diffusion limit for molecules of interest will be approached. However, to date, micro coil designs have essential been smaller version of series wound solenoidal resonators. The two-dimensional ladder networks described herein represent a fundamentally new way to image microstructures, and can be manufactured at a micron scale.

FIG. 16 shows an illustration of a micro-coil 140 for magnetic resonance imaging at cell level or spectroscopy of individual cells. The conducting strips 142 and capacitors 144 that form each resonator element 146 are of micron size scale. A plurality of resonator elements 146 are inductively coupled and are mounted on a clear biocompatible material and covered with a clear biocompatible material. The micro-coil 140 ranges in size from a cm in size down to sub-mm size and as technology progresses, probably less than 100 um in size.

Figure 17:
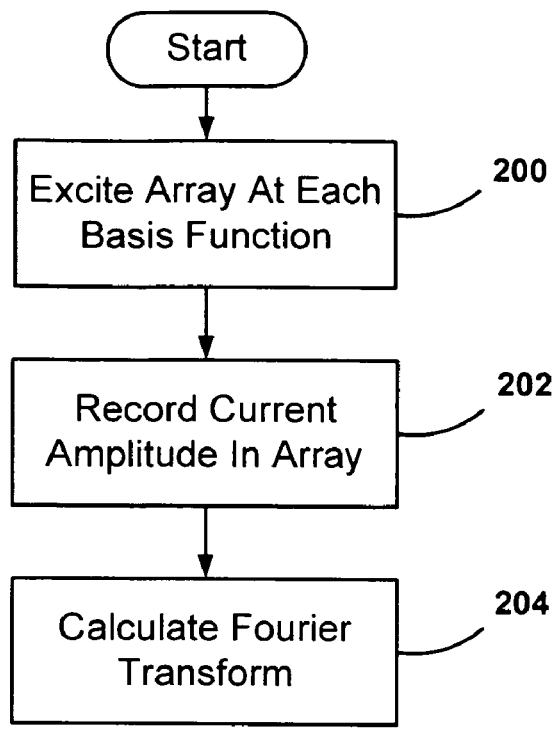
FIG. 17 shows a flowchart of a method to identify modes of an inductively coupled high-pass two-dimensional ladder network resonator.

Turning now to FIG. 17, the structure of the inductively coupled high-pass two-dimensional ladder network resonator array can be used to reconstruct all the basis functions that are used to create an image. The collection of resonant modes (i.e., the eigenfunctions) of the array structure form a complete set of functions that allow any well-behaved function to be approximated across the structure. These functions can be described as Fourier components of an actual image. The steps to recreate an image with an array is to excite the array at each basis function (step 200). This is done by exciting the array at each resonant mode with the amplitude set to the magnitude of the Fourier coefficient necessary for subsequent reconstruction of the image. For example, referring to FIG. 4a, one could start at the lowest frequency and at each resonant mode, excite the structure at the resonant frequencies and amplitudes until each resonant mode has been excited. A pickup coil records the amplitude of current in the array structure (step 202) The amplitude corresponds to the Fourier coefficient. In the five by five array of FIG. 4a, there would be twenty-five numbers which are the Fourier coefficients. A Fourier transform is calculated (step 204). The result is the image that was being created. If the structure is excited with all the resonant modes at once (i.e., in parallel) or rapidly in series (e.g., all eigenmodes are excited in less than 1/60th of a second), the array structure can be used as an imaging device.

Figure 18:
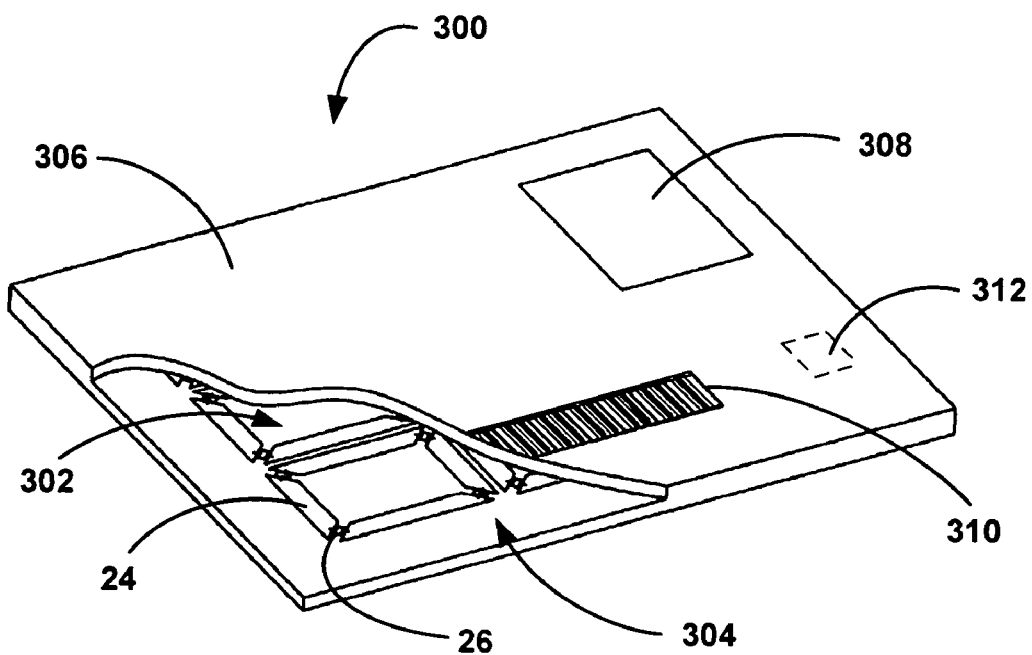
FIG. 18 shows an illustration of an inductively coupled high-pass two-dimensional ladder network resonator in an identification card configuration in accordance with the teachings of the present invention.
Figure 19:
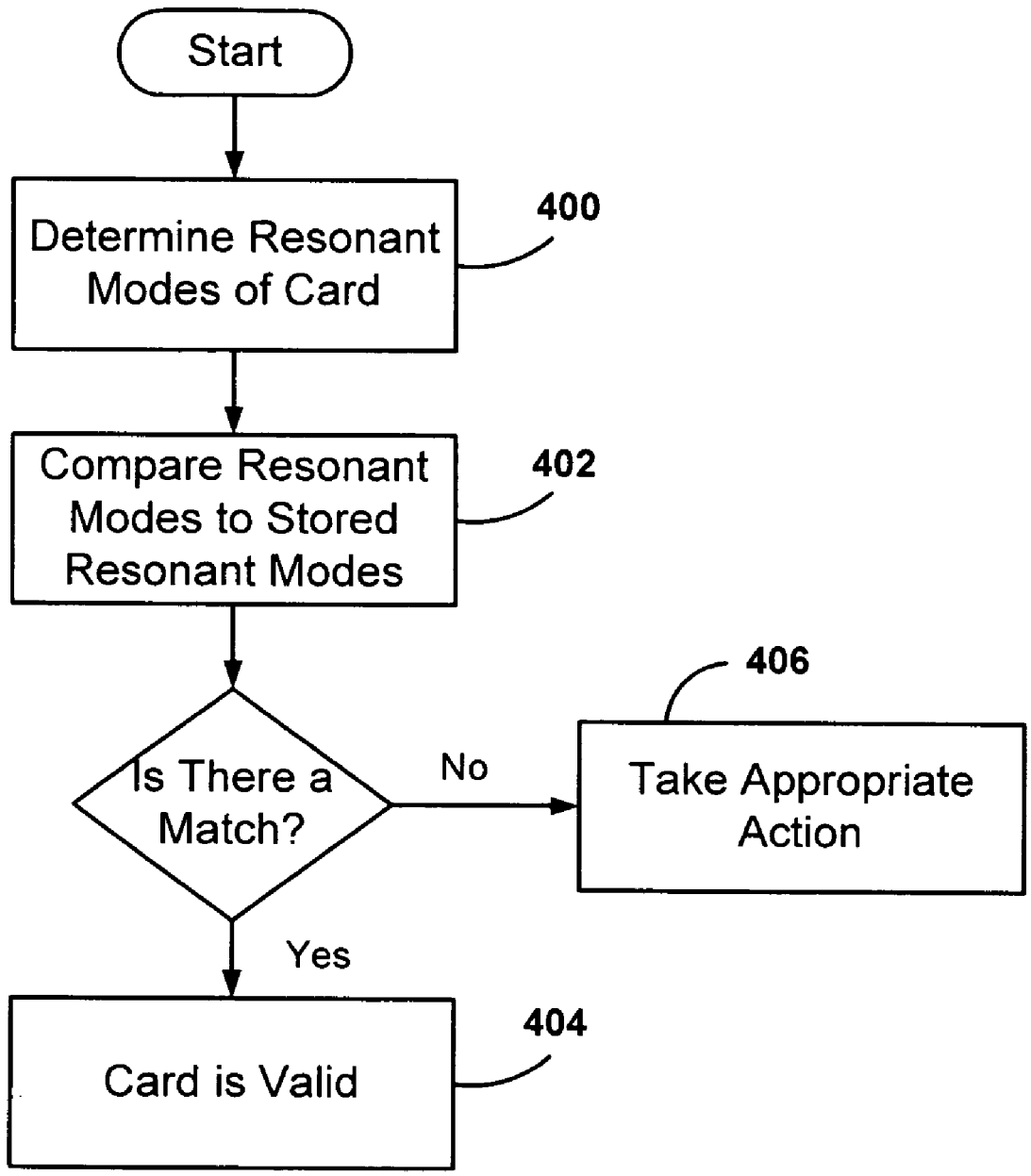
FIG. 19 shows a flowchart of a method to identify/verify the identification card of FIG. 18.

Returning briefly to FIG. 4a, the number of modes depends on the number of elements in an array. The location of the modes depends on the capacitance values in the resonator elements for a given resonator size. In other words, the level of the eigenvalues with respect to frequency can be shifted upwardly or downwardly. Turning now to FIGS. 18 and 19, the inductively coupled high-pass two-dimensional ladder network array can be used in credential card applications where the number of resonant modes (i.e. the size of an array), the mode frequency, and the amplitude of a resonant mode can be used to provide a relatively unique signature. As used herein, the term credential card includes identification cards and smart cards. The amplitude of a mode is based upon the capacitance value and the distance between resonator elements. For example, with a ten by ten array, one hundred eigenvalues exist. While there may be a frequency overlap in some of the eigenvalues, a sufficient number of frequency unique eigenvalues are present by a change in capacitance and distance between resonator elements to provide a unique identification profile for most applications.

FIG. 18 provides an illustration of a credential card 300. The credential card 300 has an array 302 of resonators 304 that are internal to the credential card 300. The array 302 is embedded in a shell 306. The shell 306 may also enclose indicia such as a photo id 308 and/or other indicia 310 such as a barcode, a signature, a holographic layer, etc. The shell may be any material that insulates the array 302 and protects the array 302 from being tampered with by individuals. For smart card applications, the credential card 300 also has an integrated circuit 310 (e.g., a "smart" chip) internal to the credential card 300. The array 302 may also serve as an antenna to provide power to the integrated circuit 310.

Turning now to FIG. 19, the resonant modes of each credential card 300 are determined and stored in a secure application such as a secure database. The steps taken to validate the credential card 300 is to determine the resonant modes of the credential card array 302 (step 400). This is done exposing the identification card 300 with a frequency sweep to determine the resonant modes. The resonant modes are compared to the stored resonant modes (step 402). If a match is made, it is determined that the credential card is valid (step 404). If no match is made, appropriate action is taken (step 406). For example, an alert or an alarm could be generated, a determination as to why no match has been made, etc.

From the foregoing, it can be seen that a inductively coupled high-pass two-dimensional ladder network has been described for applications to high-field MRI and security applications. The next-to-highest eigenvalue of the network corresponds to a normal mode giving rise to $B_1$ fields with good spatial homogeneity above the resonator plane. A solution has been presented for the general problem of an inductively coupled two-dimensional resonator array in both the strong coupling "eigenmode" limit, and the weak coupling "phased array" limit. In the strong coupling limit, the array produces a high-frequency resonant mode that can be used to generate the traditional quadrature $B_1$ field, and in the limit of weak or zero coupling reduces to the familiar phased array suitable for parallel imaging applications. The inductively coupled high-pass two-dimensional ladder network also functions as a identification card.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A high-pass two-dimensional ladder network resonator comprising:
   a plurality of inductively coupled resonators arranged in two or more directions to form an array such that each of the resonators is inductively coupled to at least two other resonators in each of the two or more directions, and
   each inductively coupled resonator comprising at least one conducting strip having a self-inductance L in a shape such that each end of a conducting strip is connected to a capacitor that is connected to another end of the at least one conducting strip.

2. The high-pass two-dimensional ladder network resonator of claim 1 wherein the plurality of inductively coupled resonators form a cylindrical shaped array of non-overlapping inductively coupled resonators.

3. The high-pass two-dimensional ladder network resonator of claim 2 wherein the cylindrical shaped array has an inner diameter that is greater than an outer diameter of a human body.

4. The high-pass two-dimensional ladder network resonator of claim 3 wherein the cylindrical shaped array is integrated into a MRI machine.

5. The high-pass two-dimensional ladder network resonator of claim 3 wherein the at least one conducting strip comprises a plurality of conducting strips, the plurality of conducting strips connected to each other such that each end of the plurality of conducting strips is connected to a capacitor.

6. The high-pass two-dimensional ladder network resonator of claim 5 wherein each end of the plurality of conducting strips is connected to the capacitor such that each of the plurality of non-overlapping inductively coupled resonators forms a rectangular shape with a capacitor at each corner of the rectangular shape.

7. The high-pass two-dimensional ladder network resonator of claim 2 wherein the cylindrical shaped array has an inner diameter that is greater than an outer diameter of an animal body.

8. The high-pass two-dimensional ladder network resonator of claim 2 wherein the cylindrical shaped array has an inner diameter that is greater than an outer diameter of a human finger.

9. The high-pass two-dimensional ladder network resonator of claim 1 wherein the plurality of inductively coupled resonators forms a substantially elliptically shaped array of inductively coupled resonators that fit over a hand.

10. The high-pass two-dimensional ladder network resonator of claim 9 wherein the substantially elliptically shaped array of non-overlapping inductively coupled resonators are covered with an electrically insulated material.

11. The high-pass two-dimensional ladder network resonator of claim 1 wherein the plurality of inductively coupled resonators forms an array of non-overlapping inductively coupled resonators that are shaped to fit over an appendage of a human body.

12. The high-pass two-dimensional ladder network resonator of claim 1 wherein the plurality of inductively coupled resonators are shaped to fit over a head.

13. The high-pass two-dimensional ladder network resonator of claim 12 wherein the at least one conducting strip comprises a plurality of conducting strips, the plurality of conducting strips connected to each other such that each end of the plurality of conducting strips is connected to a capacitor.

14. The high-pass two-dimensional ladder network resonator of claim 1 wherein the plurality of inductively coupled resonators are mounted to a flexible substrate.

15. The high-pass two-dimensional ladder network resonator of claim 14 wherein the flexible substrate is substantially moldable.

16. The high-pass two-dimensional ladder network resonator of claim 14 wherein the plurality of inductively coupled resonators are covered with an electrically insulated material.

17. The high-pass two-dimensional ladder network resonator of claim 1 wherein the plurality of inductively coupled resonators is sized such that the high-pass two-dimensional ladder network resonator has a size of between approximately 1 centimeter and approximately 100 micrometers.

18. The high-pass two-dimensional ladder network resonator of claim 17 wherein the high-pass two-dimensional ladder network is covered with a biocompatible material.

19. The high-pass two-dimensional ladder network resonator of claim 1 wherein the plurality of inductively coupled resonators forms an endocoil.

20. The high-pass two-dimensional ladder network resonator of claim 19 wherein the endocoil is pill-sized.

21. The high-pass two-dimensional ladder network resonator of claim 1 wherein the plurality of inductively coupled resonators forms an array that is embedded in a credential card.

22. The high-pass two-dimensional ladder network resonator of claim 21 wherein the credential card further comprises at least one identifier indicia on an external surface of the identification card.

23. The high-pass two-dimensional ladder network resonator of claim 22 wherein the at least one identifier indicia comprises a photographic image.

24. The high-pass two-dimensional ladder network resonator of claim 21 wherein the credential card further includes an integrated circuit embedded in the credential card.

25. The high-pass two-dimensional ladder network resonator of claim 21 wherein the array is an array that has a minimum size of a five by five array.

26. A method in accordance with the high-pass two-dimensional ladder network resonator of claim 1 to reconstruct the basis functions of the high-pass two-dimensional ladder network resonator comprising the steps of: exciting the high-pass two-dimensional ladder network resonator at each resonant mode; detecting an amplitude of current in the high-pass two-dimensional ladder network resonator at each resonant mode; and calculating a Fourier transformation using the amplitude of current detected at each resonant mode as Fourier coefficients in the Fourier transformation.

27. The method of claim 26 wherein the step of detecting the amplitude of current includes the step of detecting the amplitude of current with a pick-up coil.

28. The method of claim 26 wherein the step of exciting the high-pass two-dimensional ladder network resonator at each resonant mode includes the step of exciting the high-pass two-dimensional ladder network resonator at each resonant mode with an amplitude set to a magnitude of the Fourier coefficient corresponding to the eigenfunction of the resonant mode.

29. The method of claim 26 wherein the step of exciting the high-pass two-dimensional ladder network resonator at each resonant mode includes the step of exciting the high-pass two-dimensional ladder network resonator at each resonant mode simultaneously.

* * * * *